(12) United States Patent
Katkar et al.

(10) Patent No.: US 10,508,030 B2
(45) Date of Patent: Dec. 17, 2019

(54) SEAL FOR MICROELECTRONIC ASSEMBLY

(71) Applicant: Invensas Bonding Technologies, Inc., San Jose, CA (US)

(72) Inventors: Rajesh Katkar, San Jose, CA (US); Liang Wang, Milpitas, CA (US); Cyprian Emeka Uzoh, San Jose, CA (US); Shaowu Huang, Sunnyvale, CA (US); Guilian Gao, San Jose, CA (US); Ilyas Mohammed, Santa Clara, CA (US)

(73) Assignee: Invensas Bonding Technologies, Inc., San Jose, CA (US)

( * ) Notice: Subject to any disclaimer, the term of this patent is extended or adjusted under 35 U.S.C. 154(b) by 0 days.

(21) Appl. No.: 15/920,759

(22) Filed: Mar. 14, 2018

(65) Prior Publication Data

US 2018/0273377 A1 Sep. 27, 2018

Related U.S. Application Data

(60) Provisional application No. 62/474,478, filed on Mar. 21, 2017.

(51) Int. Cl.
*H01L 23/10* (2006.01)
*B81C 1/00* (2006.01)
(Continued)

(52) U.S. Cl.
CPC ........ *B81C 1/00333* (2013.01); *B81B 7/0032* (2013.01); *B81B 7/0074* (2013.01);
(Continued)

(58) Field of Classification Search
CPC . B81B 7/0032; B81B 7/0058; B81B 2207/09; B81B 2207/091;
(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

JP 2013-33786 2/2013
JP 2018-160519 A 10/2018
(Continued)

OTHER PUBLICATIONS

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.
(Continued)

*Primary Examiner* — Eduardo A Rodela

(57) ABSTRACT

Representative implementations of techniques and devices provide seals for sealing the joints of bonded microelectronic devices as well as bonded and sealed microelectronic assemblies. Seals are disposed at joined surfaces of stacked dies and wafers to seal the joined surfaces. The seals may be disposed at an exterior periphery of the bonded microelectronic devices or disposed within the periphery using the various techniques.

14 Claims, 13 Drawing Sheets

(51) Int. Cl.
  *B81B 7/00* (2006.01)
  *H01L 23/04* (2006.01)
  *H01L 23/053* (2006.01)
  *H01L 23/02* (2006.01)

(52) U.S. Cl.
  CPC ...... *B81C 1/00261* (2013.01); *B81C 1/00269* (2013.01); *H01L 23/02* (2013.01); *H01L 23/04* (2013.01); *H01L 23/053* (2013.01); *H01L 23/10* (2013.01); *B81C 2203/038* (2013.01)

(58) Field of Classification Search
  CPC ........ B81B 2207/092; B81B 2207/093; B81B 2207/095; B81B 2207/097; B81B 2207/098; B81C 1/00261; B81C 1/00269; B81C 2203/01; B81C 2203/0109; B81C 2203/0118; B81C 2203/0163; B81C 2203/0154; B81C 2203/0172; B81C 2203/019; H01L 23/02; H01L 23/04; H01L 23/053; H01L 23/10
  See application file for complete search history.

(56) References Cited

U.S. PATENT DOCUMENTS

| | | | |
|---|---|---|---|
| 6,080,640 A | 6/2000 | Gardner et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,191,756 B2* | 6/2012 | Coppeta | A61K 9/0097 228/115 |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu et al. | |
| 8,809,123 B2 | 8/2014 | Liu et al. | |
| 9,142,517 B2 | 9/2015 | Liu et al. | |
| 9,171,756 B2 | 10/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,656,852 B2 | 1/2017 | Cheng et al. | |
| 9,620,481 B2 | 4/2017 | Edelstein et al. | |
| 9,723,716 B2 | 8/2017 | Meinhold | |
| 9,799,587 B2 | 10/2017 | Fujii et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,026,605 B2 | 7/2018 | Doub et al. | |
| 10,075,657 B2 | 9/2018 | Fahim et al. | |
| 10,269,756 B2 | 4/2019 | Uzoh | |
| 10,276,619 B2 | 4/2019 | Kao et al. | |
| 2004/0084414 A1 | 5/2004 | Sakai et al. | |
| 2006/0057945 A1 | 3/2006 | Hsu et al. | |
| 2006/0197215 A1* | 9/2006 | Potter | B81C 1/00269 257/704 |
| 2007/0111386 A1 | 5/2007 | Kim et al. | |
| 2012/0286380 A1* | 11/2012 | Yazdi | B81C 1/00333 257/415 |
| 2012/0326248 A1* | 12/2012 | Daneman | B81B 7/02 257/415 |
| 2013/0277774 A1* | 10/2013 | Frey | B81B 7/007 257/415 |
| 2014/0175655 A1 | 6/2014 | Chen et al. | |
| 2015/0064498 A1 | 3/2015 | Tong | |
| 2015/0091153 A1* | 4/2015 | Liu | B81C 1/00293 257/704 |
| 2016/0137492 A1 | 5/2016 | Cheng et al. | |
| 2016/0229685 A1* | 8/2016 | Boysel | B81B 7/007 |
| 2016/0343682 A1 | 11/2016 | Kawasaki | |
| 2017/0008757 A1 | 1/2017 | Cheng et al. | |
| 2017/0025381 A1 | 1/2017 | Tsai et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |

FOREIGN PATENT DOCUMENTS

| | | |
|---|---|---|
| KR | 10-2005-0101324 A | 10/2005 |
| WO | 2005-043584 A2 | 5/2005 |

OTHER PUBLICATIONS

International Search Report and Written Opinion, dated May 31, 2018, for PCT Application No. PCT/US2018/022688, 14 pages.
Moriceau, H. et al., "Overview of Recent Direct Wafer Bonding Advances and Applications", Advances in Natural Sciences-Nanoscience and Nanotechnology, 2010, 12 pages.
Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.
Plobi et al., "Wafer Direct Bonding: Tailoring Adhesion Between Brittle Materials," Materials Science and Engineering Review Journal, 1999, 88 pages.

\* cited by examiner

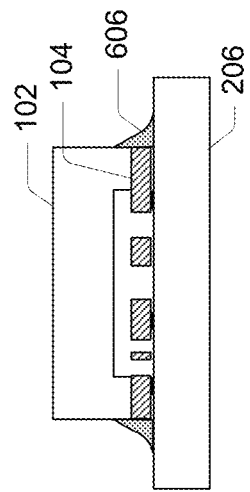
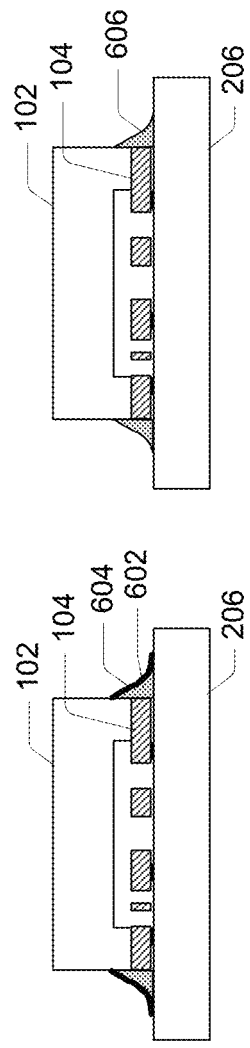
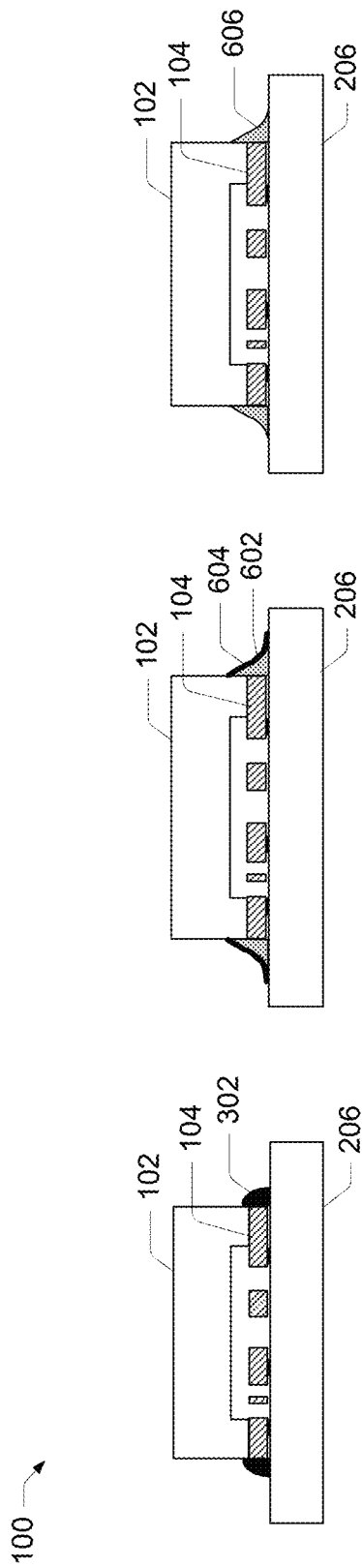
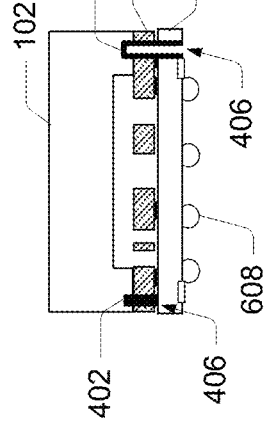
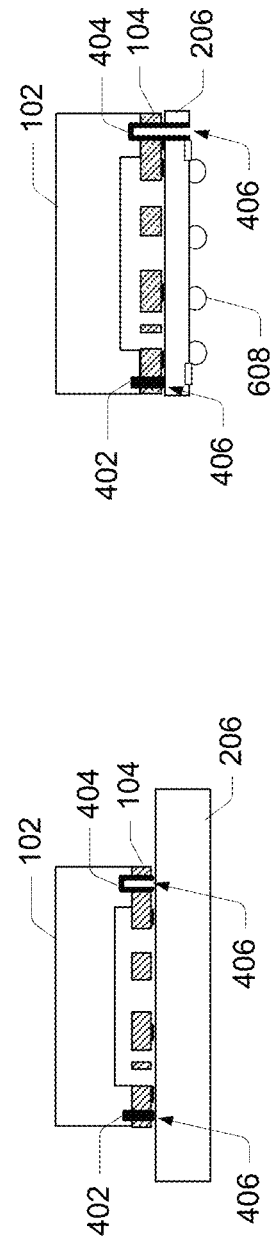
FIG. 6A
FIG. 6B
FIG. 6C
FIG. 6D
FIG. 6E

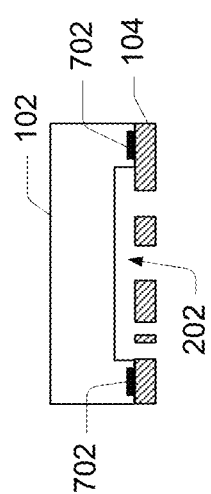
FIG. 7A
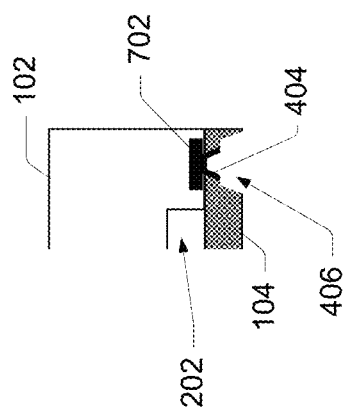
FIG. 7B
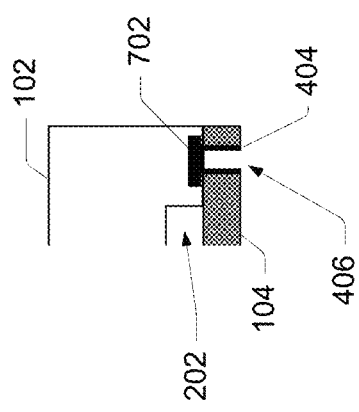
FIG. 7C
FIG. 7D

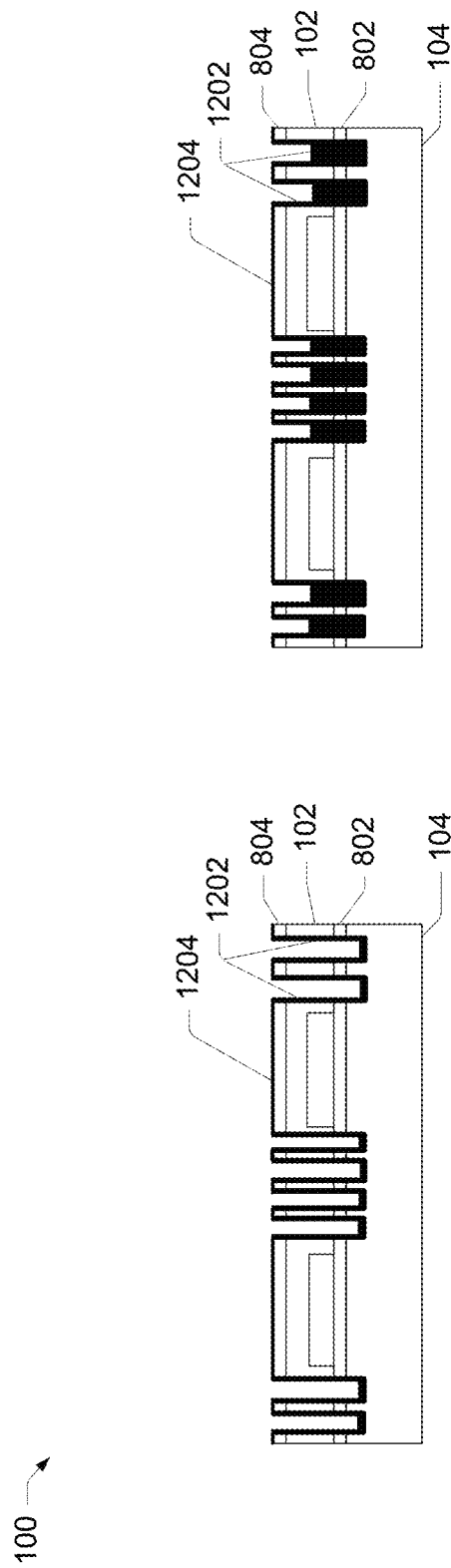
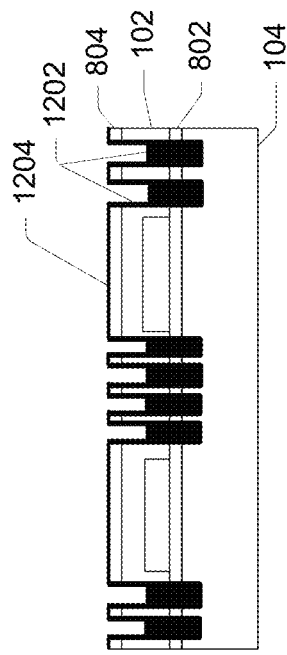
FIG. 13A
FIG. 13B
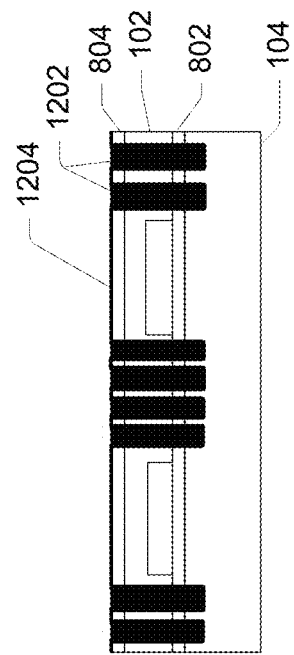
FIG. 13C

SEAL FOR MICROELECTRONIC ASSEMBLY

PRIORITY CLAIM AND CROSS-REFERENCE TO RELATED APPLICATION

This application claims the benefit under 35 U.S.C. § 119(e)(1) of U.S. Provisional Application No. 62/474,478, filed Mar. 21, 2017, which is hereby incorporated by reference in its entirety.

FIELD

The following description relates to processing of integrated circuits ("ICs"). More particularly, the following description relates to devices and techniques for processing IC dies and assemblies.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, a variety of sensors, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting.

Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.02 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly longer than the thickness of the die itself. For interconnection to be achieved within a stack of die packages, interconnection structures for mechanical and electrical connection may be provided on both sides (e.g., surfaces) of each die package (except, perhaps, for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein. In other examples, Through Silicon Vias (TSVs) are used for interconnection to be achieved within a stack of die packages. In some cases, dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

Stacked die and wafer arrangements, including bonded arrangements, may also be used to form assembled components such as microelectromechanical systems (MEMS), sensors, and the like. See, for example, U.S. Pat. No. 7,109,092, which is incorporated herein in its entirety. In many of these arrangements, it is desirable for the stacked dies and wafers to be sealed at their joined surfaces, for instance, to form a sensor cavity. In some cases, making such seals reliable and long-lasting can be problematic, particularly at the chip scale.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIGS. 6A-6E illustrate example embodiments of seals and sealed microelectronic devices, according to various embodiments.

FIGS. 7A-7D illustrate example embodiments of seals and sealed microelectronic devices, according to further embodiments.

FIGS. 13A-13C illustrate example embodiments of sealed microelectronic devices, according to various embodiments.

DETAILED DESCRIPTION

Overview

Figure 1:
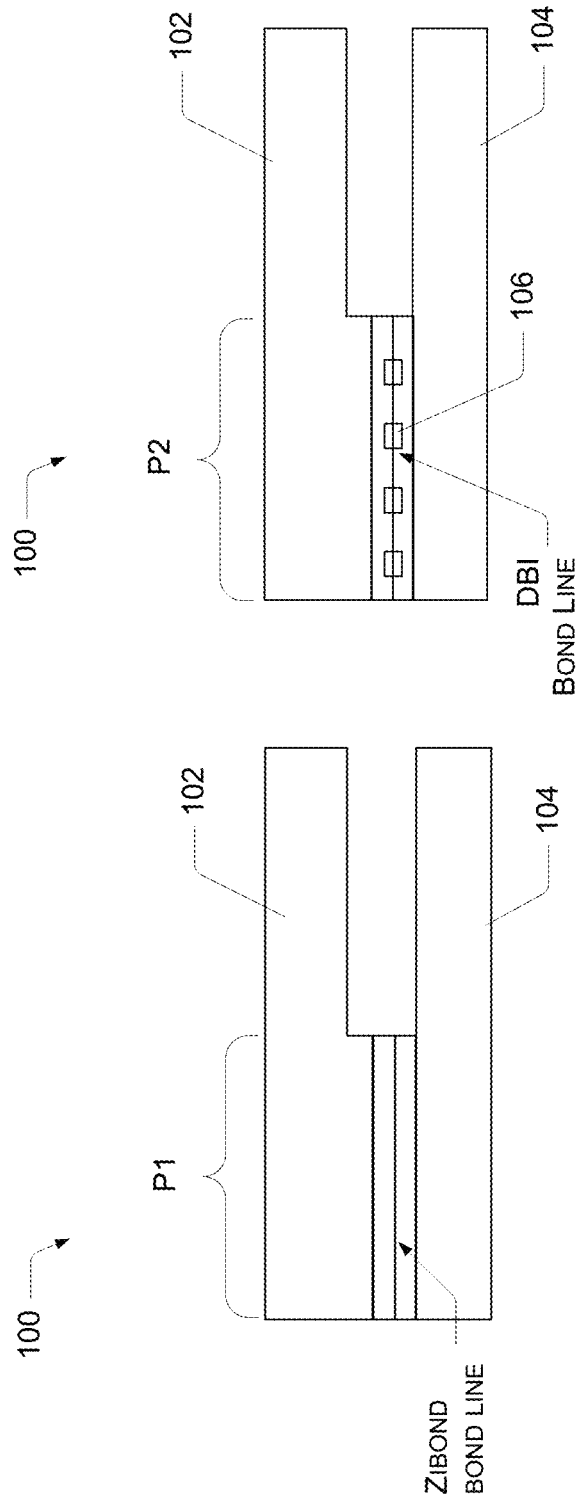
FIG. 1A shows a cavity wafer bonded to a MEMS wafer using a Zibond technique.
FIG. 1B shows a cavity wafer bonded to a MEMS wafer using a Zibond technique with a DBI technique.

Various embodiments of techniques and devices for forming seals and sealed microelectronic devices are disclosed. Seals are disposed at joined (e.g., bonded, coupled, etc.) surfaces of stacked dies and wafers to seal (e.g., hermetically seal) the joined surfaces. The joined surfaces may be sealed to form sensor cavities, or the like, as part of the microelectronic devices. For instance, when a die with a recessed surface is bonded to another die with a flat surface or a recessed surface, a cavity can be formed between the two dies. In some applications, it may be desirable for this cavity to be hermetically sealed, to maintain a specific vacuum level inside the cavity and for predetermined leak rates to be maintained.

The leak rate of a sealed cavity can be looked at as a function of the cavity's volume. For example, if the volume of a cavity is less than or equal to 0.01 cc, generally, the leak rate is to be below 5E-8 atm-cc/s of air to consider the cavity hermetically sealed. If the volume of the cavity ranges between 0.01 and 0.4 cc, the leak rate is to be below 1E-7, and if the volume is greater than 0.4 cc, then the leak rate is to be below 1E-6 for a hermetically sealed cavity (per MIL-STD-883 Method 1014, MIL-STD-750 Method 1071).

The integrity of a seal at the periphery of a stack of dies can be critical to maintain the application specific hermeticity and low leak rates of the package. Metals, ceramics, and glasses are the typical materials used to form the seal and to prevent water vapor or other gases (e.g. oxygen, etc.) from accessing components inside the package. A properly made hermetic seal with a sufficiently low leak rate can keep the interior of a package dry and moisture free for many years.

The techniques disclosed herein include forming seals of one or more metallic materials (for example) at a joint (e.g., a bond line, a seam, etc.) of at least two surfaces, which seals the joined surfaces at the joint. In various implementations, metallic materials may be deposited using electroless plating, or the like. In some embodiments, metallic materials may be deposited directly onto the joined surfaces at or around the joint. In other embodiments, one or more non-metallic materials may be deposited onto the joined surfaces, and metallic material can be deposited over the non-metallic material(s), sealing the joint. The seal may include a continuous sealing ring formed completely around joined dies or wafers (e.g., a periphery of the devices) or one or more partial seals, as desired.

In various embodiments, the techniques disclosed can seal dies and wafers that are stacked and bonded using "ZIBOND®" techniques, which can benefit from the added seal. For example, at FIG. 1A, a cavity wafer 102 is bonded to a microelectromechanical system (MEMS) wafer 104 (or any other wafer) using a ZIBOND® technique, for example, to form a microelectronic device 100 such as a MEMS sensor device. A cavity wafer 102 (or a die) may have 1 or more cavities or recesses of the same or varying size. Especially-flat surfaces of the two wafers (102 and 104) are bonded together using a low temperature covalent bond between the two corresponding semiconductor and/or insulator layers. While the bond may be good, the seal may not be adequate as a hermetic seal, and the leak rates may not be as low as desired for the application. Further, the bond line width (P1) may not be optimal, since a relatively long bond line can unnecessarily increase the die size and can reduce the number of dies fabricated per wafer.

In another example, as shown at FIG. 1B, the seal may be improved by forming one or more metal-to-metal interconnections along the bonding seam using a Direct Bond Interconnect (DBI®) technique. Metallic lines 106 are deposited along each of the surfaces to be joined, so as to be aligned to each other, and form metal-to-metal bonds when set together using temperature and/or pressure. In some cases, the DBI lines 106 can help to reduce the bond line width (P2) while improving the hermeticity of the joint. However, the bond line width (P1) needed for utilizing a ZiBond method may not be adequate for the application (e.g., a 100 micron bond line width using Zibond may be reduced to tens of microns or less than 10 microns, using DBI for example). Further, such DBI bonds are not easy to achieve, potentially adding to the complexity and cost of the assembly.

Figure 2:
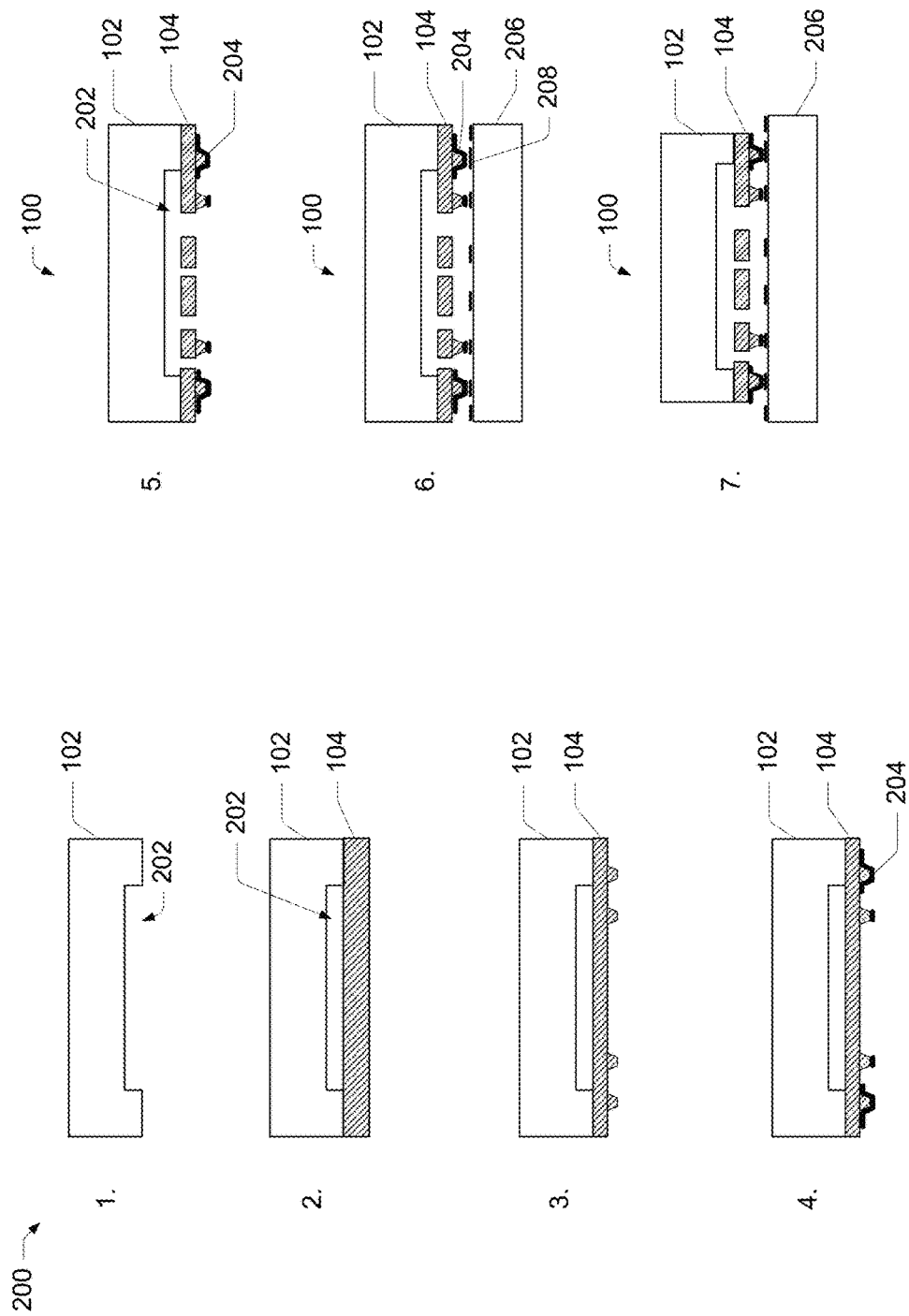
FIG. 2 is a graphical flow diagram illustrating an example processing sequence to form a stacked microelectronic device.

FIG. 2 is a graphical flow diagram illustrating an example processing sequence 200 to form a stacked microelectronic device 100. The process 200 and the stacked microelectronic device 100 form a background for discussing various sealing techniques and devices. In various embodiments, the process 200 described with reference to FIG. 2 may be modified to include the techniques and devices for hermetically sealing bonded components at the bond joints. FIG. 2 describes the process for a 3 die stack creating a hermetically sealed cavity 202 between top (and middle) and (middle and) bottom die. But a stack could also include only 2 dies with a cavity 202 between them, as depicted in FIG. 1.

At block 1, a recessed cavity wafer 102 is formed. Although one cavity 202 is shown in the illustration at block 1, one or more cavities 202 of similar or different dimensions may be formed per die location, effectively forming several such recessed cavities 202 on a wafer (or die) 102. At block 2, the cavity wafer 102 is bonded to a MEMS wafer 104 (or any other wafer or die) closing the cavity 202 within. The cavity wafer 102 can be bonded to the MEMS wafer 104 using an intimate surface bonding technique, for example, a ZIBOND® technique, wherein insulating surfaces (e.g., SiOx—SiOx, etc.) are bonded. At block 3, the MEMS wafer 104 may be thinned and patterned to form stand-offs. At block 4, metallization 204 can be added to the patterned surface of the MEMS wafer 104, including pads, contacts, traces, and so forth. In an alternate example, no metallization 204 is added to the surface of the MEMS wafer 104. In the example, the microelectronic device 100 can be attached to another device, such as a logic device wafer, for example, using a Zibond technique (e.g., SiOx—SiOx bond) or the like at the bonded surfaces, or using other bonding techniques for dielectrics (such as a polymeric material, e.g. die attached film or paste) on one or both bonded surfaces.

At block 5, openings are formed in the MEMS wafer 104, accessing the cavity 202, to define the characteristics of the microelectronic device 100, based on the application. At block 6, the microelectronic device 100 can be attached to a logic device wafer (or die) 206, to provide logic/control (for example) for the microelectronic device 100. Metallization layer 204 contact pads of the microelectronic device 100 are coupled to contacts 208 on the surface of the logic device 206. At block 7, portions of the microelectronic device 100 (such as portions of the cavity wafer 102) are removed (e.g., etched, etc.) to provide access to other contact pads of the logic device wafer 206, and so forth. In some instances, the Zibond or DBI interface between the cavity wafer 102 and the MEMS wafer 104 may provide an adequate resistance to the flow of fluids, such as gases and/or liquids. In other embodiments, one or more of the bond lines or coupling joints of the microelectronic device 100 can be sealed for hermeticity (e.g., a predetermined resistance to the flow of fluids, such as gases and/or liquids, and sufficiently low moisture vapor transmission rate, oxygen transmission rate, etc.), as discussed below.

Example Embodiments

To ensure a strong and hermetically sealed bond, the techniques disclosed herein include bonding insulator surfaces of the wafers (e.g., 102 and 104), then adding a metallic seal at the bond line to improve the hermeticity, as discussed further below.

Figure 3C:
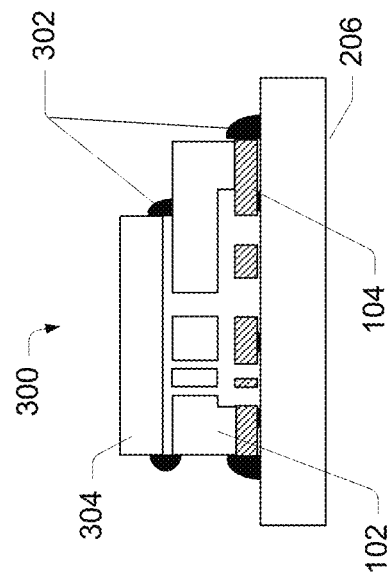
FIG. 3C shows a sealed multi-stack microelectronic arrangement.
Figure 3A:
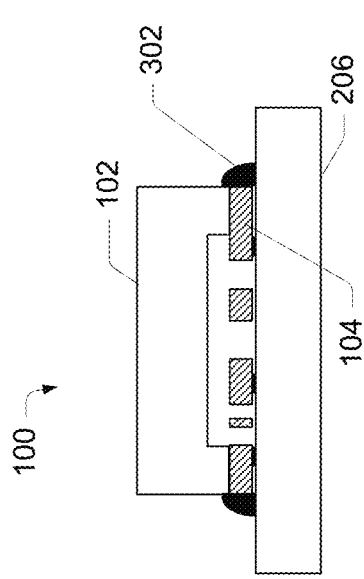
FIG. 3A shows a plan view of an example sealed microelectronic device, according to an embodiment.
Figure 3B:
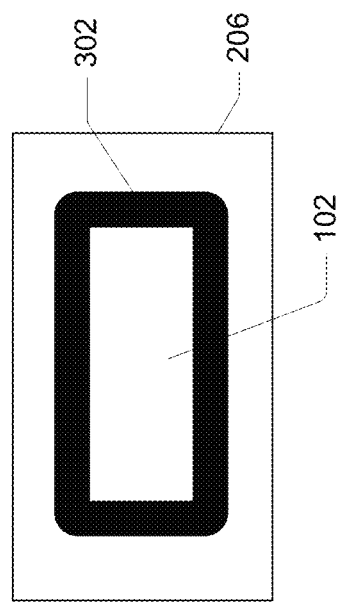
FIG. 3B shows a top view of the example sealed microelectronic device, according to the embodiment.

FIG. 3 shows example embodiments of sealing a microelectronic device 100, such as the microelectronic device 100 formed with reference to FIG. 2. As shown by the side view of the microelectronic device 100 at FIG. 3A and the top view at FIG. 3B, a metallic seal ring 302 can be formed surrounding the bonded joint of the cavity wafer 102 and the MEMS wafer 104, and can also be extended to seal the logic device 206 to the MEMS wafer 104. The seal ring 302 creates a hermetic seal around a periphery of the microelectronic components (e.g., 102, 104, and 206), fully sealing the joints between the components. The seal ring 302 can be located to seal any or all of the joints between the microelectronic components (e.g., 102, 104, and 206), as desired.

In various embodiments, the seal ring 302 is comprised of a metallic material (i.e., a metal such as copper, for example, an alloy, or a metallic composition). In some embodiments, two or more metallic materials may be used in layers (or other combinations) to form the seal ring 302. In the various embodiments, the seal ring 302 is deposited using electroless plating, electro-deposition, mechanical printing, or various combinations thereof, or the like.

As shown at FIG. 3C, multiple seal rings 302 may be used to seal between multiple components (e.g., 102, 104, 206, and 304) at different stacking levels in a stacked microelectronic arrangement 300. Seal rings 302 may be used at any or all of the levels of the stacked arrangement 300, as desired. While complete seal rings 302 are discussed and illustrated, partial seal rings 302 may also be used where desired to form seals at bond joints or between components (e.g., 102, 104, 206, and 304) of a microelectronic device (e.g., 100, 300) or assembly.

Figure 4:
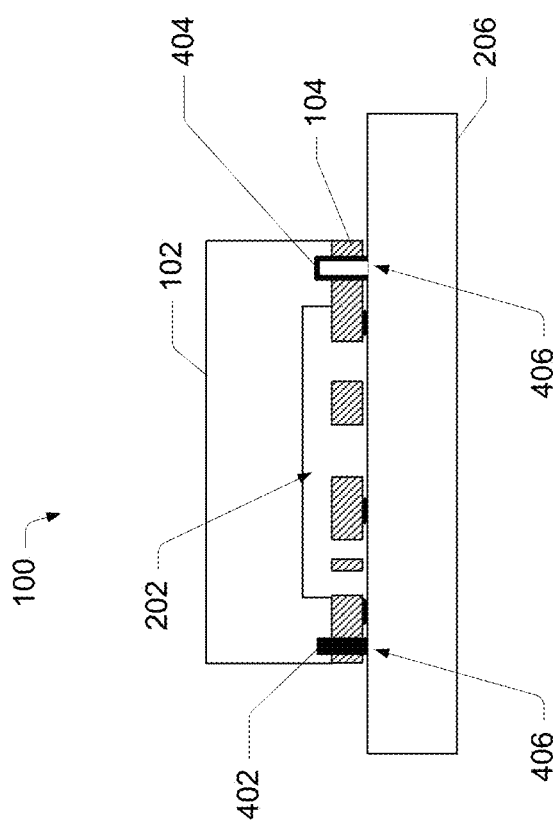
FIG. 4 shows an example sealed microelectronic device, according to another embodiment. Two separate configurations of example seals are illustrated in the example.

FIG. 4 shows an example sealed microelectronic device 100, according to another embodiment, using interior seals (e.g., 402 and 404). Alternately or in addition to the exterior seal rings 302 shown in FIG. 3, interior seals (e.g., 402 and 404) are formed after drilling, etching, or otherwise forming a channel 406 (fully or partially) around an inside perimeter of the bonded components (e.g., 102, 104, and 206). Two separate configurations of example seals are illustrated in FIG. 4, a filled seal 402 and a conformal seal 404. Both configurations are formed in channels 406, drilled portions, or the like, as discussed further below. The filled seal ring 402 mostly or fully fills the channel 406 or drilled cavity with one or more metallic materials to form the hermetic seal at the bond joint. The conformal seal ring 404 plates the walls of the channel 406 or cavity with the one or more metallic materials to form the hermetic seal. In various implementations, either the filled seal 404 or the conformal seal 406 may be used to hermetically seal two or more components (e.g., 102, 104, and 206), as desired. In various examples, multiple concentric seal rings (e.g., 302, 402, and 404) may be used to seal two (or more) components (e.g., 102, 104, and 206). The channel(s) 406 may extend through component 104 and to the interface with component 102 or, shown, into component 102.

Figure 5:
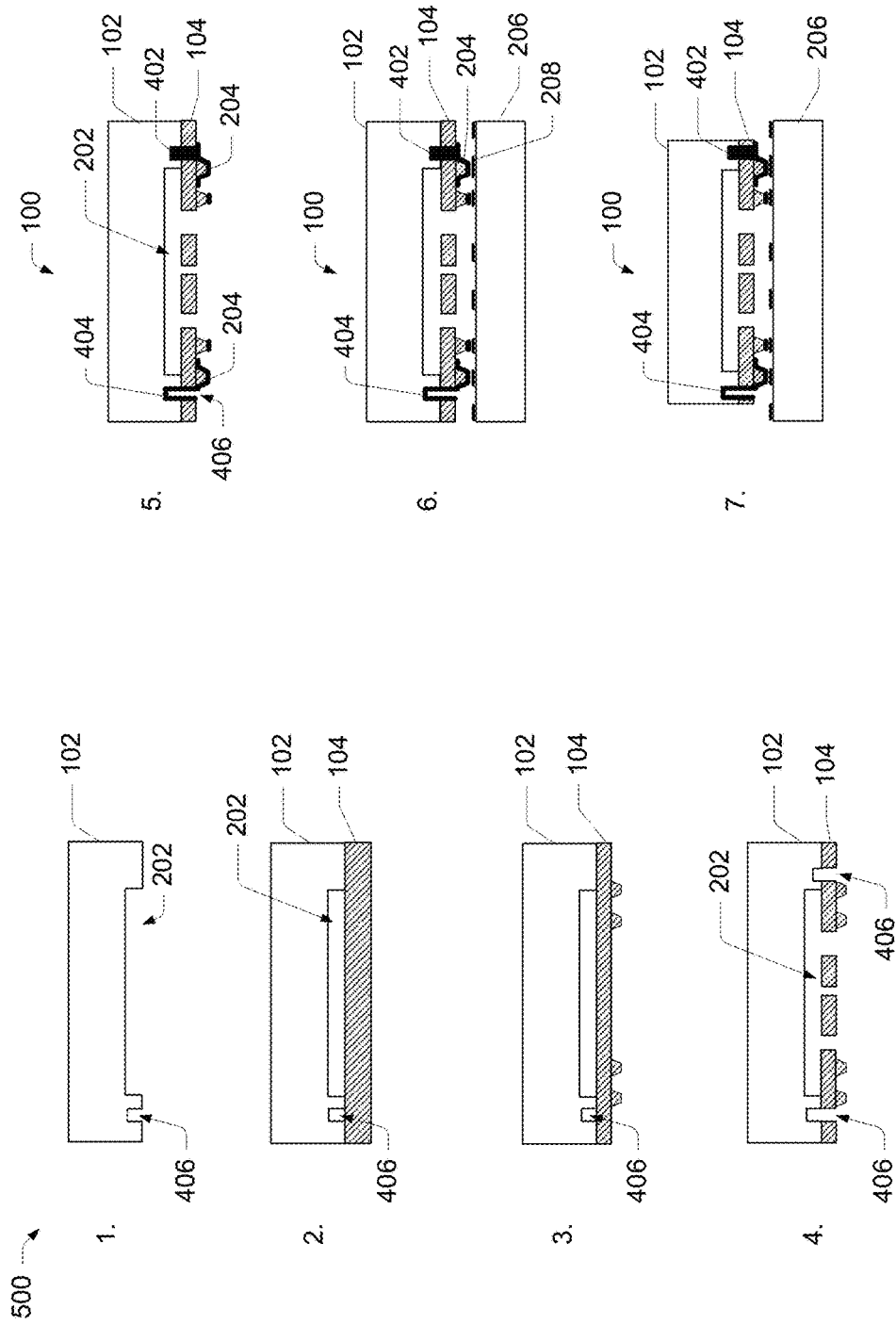
FIG. 5 is a graphical flow diagram illustrating an example processing sequence to form a sealed microelectronic device, according to an embodiment.

FIG. 5 is a graphical flow diagram illustrating an example processing sequence 500 to form a sealed microelectronic device 100, according to an embodiment using interior seals (e.g., 402 and 404). In various embodiments, the process 500 described with reference to FIG. 5 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed. A channel 406 (or "cavity ring," partly or fully surrounding the cavity 202) is formed on the cavity-side surface of the wafer 102. The channel 406 may be formed by etching, drilling, or otherwise removing material from the surface of the wafer 102.

At block 2, the cavity wafer 102 is bonded to a MEMS wafer 104 closing the cavity 202 within. The cavity wafer 102 can be bonded to the MEMS wafer 104 using an intimate surface bonding technique, for example, such as a ZIBOND® technique, wherein insulating surfaces (e.g., SiOx—SiOx, etc.) are bonded. In another example, the cavity wafer 102 can be bonded to the MEMS wafer 104 using another dielectric bonding technique (e.g. die attach film or paste, a polymeric material such as a silicone or epoxy, or the like, which may not provide a hermetic seal and may not improve or fix a hermetic seal).

At block 3, the MEMS wafer 104 may be thinned and patterned to form stand-offs. In another case, the stand-offs are optional and may not be formed on the MEMS wafer 104. In such a case, the standoffs can be formed on the logic wafer 206 or can be created by any other material (e.g. die attach film or paste, etc.). At block 4, openings are formed in the MEMS wafer 104, accessing the cavity 202, to define the characteristics of the microelectronic device 100, based on the application. Also, channels 406 are formed in the MEMS wafer 104 (and in the cavity wafer 102, in some examples) for forming interior seals (e.g., 402 and 404) to seal the bonding joint between the cavity wafer 102 and the MEMS wafer 104. In one case the MEMS wafer 104 can be drilled to open an area in the MEMS wafer 104 that is aligned with the cavity ring channel 406 previously formed in the cavity wafer 102. In an alternate case, the MEMS wafer 104 and the cavity wafer 102 can be drilled together to form the cavity ring channel 406 (e.g., the channel 406 in the cavity wafer 102 is formed at this step, while drilling the MEMS wafer 104, rather than being pre-formed prior to bonding the cavity wafer 102 to the MEMS wafer 104).

At block 5, metallization 204 is added to the patterned surface of the MEMS wafer 104, including pads, contacts, traces, and so forth. The cavity ring channel 406 can also be metallized at this time. The channel 406 can be partially or fully filled/plated to form a filled seal ring 402, or the walls of the channel 406 can be metallized/plated to form a conformal seal ring 404. Either the filled seal ring 402 or the conformal seal ring 404 (whichever is used) hermetically seal the bond joint between the cavity wafer 102 and the MEMS wafer 104.

In another example, after bonding, the MEMS wafer 104 and the cavity wafer 102 can be drilled together to form the cavity ring channel 406, which can be metallized and then the openings to the cavity 202 are formed in the MEMS wafer 104.

At block 6, the microelectronic device 100 may be attached to a logic device 206, to provide logic/control (for example) for the microelectronic device 100. Contact pads of the metallized layer 204 of the microelectronic device 100 can be coupled to contacts 208 on the surface of the logic device 206. At block 7, portions of the microelectronic device 100 may be removed (e.g., etched, etc.) to provide access to other contact pads of the logic device 206, and so forth.

FIGS. 6A-6E illustrate example embodiments of seals 302, 402, and 404 and sealed microelectronic devices 100, according to various embodiments. A first embodiment, illustrated at FIG. 6A, shows exterior seals 302 implemented as discussed above with reference to FIGS. 3 and 4. Each seal 302 forms a bead that covers one or more bonding or coupling joints between the microelectronic components 102, 104, and 206, to hermetically seal the joints. The seals 302 can be comprised of a metallic material such as a metal, an alloy, or a metal composite, for example a combination of two or more metals, a metal-glass composite material, a metal-ceramic composite, or the like.

A second embodiment, illustrated at FIG. 6B, shows seals having a layered approach, where a polymer seal 602 is applied to the exterior of the joint first and a metallic material seal 604 is deposited over the polymer seal 602, forming a hermetic seal. In alternate implementations, multiple polymer materials forming one or more polymer seals 602 and/or multiple metallic layers forming one or more metallic seals 604 may also be used to form a seal ring.

A third embodiment, illustrated at FIG. 6C, shows another exterior seal ring 606, comprised of a sinterable conductive paste, a fritted glass composite, or the like. The metallic or glass components in the deposited seal 606 material provide the hermetic seal desired.

A fourth embodiment, illustrated at FIG. 6D, shows interior seals 402 and 404 as discussed above with reference to FIGS. 5 and 6. A channel 406 is formed through the MEMS wafer 104 and into the cavity wafer 102, and the channel 406 is plated from the MEMS wafer 104 side with metallic material, either fully (e.g., 402), partially (not shown) or conformal (e.g., 404) to the channel 406 walls.

A fifth embodiment, illustrated at FIG. 6E, shows an example of forming a seal ring (e.g., 404) through multiple components (e.g., 102, 104, and 206). In this example, the logic wafer 206 (or the like) can be thinned and drilled through, similar to the MEMS wafer 104. For example, the logic wafer 206, MEMS wafer 104, and cavity wafer 102 may be bonded in a process and then drilled together, or in separate steps to be aligned. Plating or filling the drilled channel 406 from the logic wafer 206 side forms a seal ring (e.g., 404) that extends from the logic wafer 206, through the MEMS wafer 104, and into the cavity wafer 102, hermetically sealing each of the bonding joints and the spaces between the components (e.g., 102, 104, and 206). Alternately, the seal (e.g., 404) may extend through only some of the layers/components as desired. In various embodiments, the metallization of the seals (e.g., 402, 404) may be electrically continuous with or coupled to one or more device pads, for grounding, or the like (which may also be electrically continuous with a ball terminal 608 (for example) on the package. While multiple types of metallization (conformal, nonconformal) are shown in FIGS. 6D, 6E and elsewhere in this disclosure, only a single type of metallization may be used at a time to form a continuous or discontinuous shape for inhibiting fluid flow and, thus, improving hermeticity.

FIGS. 7A-7D illustrate example embodiments of seals 402 and 404 and sealed microelectronic devices 100, according to further embodiments. In one embodiment, illustrated at FIG. 7A, an embedded metallic ring 702 is partially or fully embedded within the cavity wafer 102 (and/or the MEMS wafer 104) and partially or fully surrounds the cavity 202. The embedded metallic ring 702, which may be disposed at or near the bond line, can aid in sealing the bond joint between the cavity wafer 102 and the MEMS wafer 104. A via (not shown for the sake of simplicity) may extend through cavity wafer 102 and contact the metallic ring 702. In another embodiment, illustrated at FIG. 7B, the microelectronic device 100 includes an embedded metallic ring 702 partially or fully surrounding the cavity 202, as well as one or more interior seals 402 and/or 404, as discussed above with reference to FIGS. 5 and 6. A channel 406 is formed through the MEMS wafer 104 and into the cavity wafer 102, to the embedded metallic ring 702, and the channel 406 is plated from the MEMS wafer 104 side with metallic material, either fully (e.g., 402), partially (not shown) or conformal (e.g., 404) to the channel 406 walls.

As shown in FIG. 7B, the interior seals 402 and/or 404 are landed on (e.g., are in contact with) the embedded metallic ring 702. FIGS. 7C and 7D show close detail views of two possible embodiments (of many) for this arrangement. For example, in FIG. 7C, the channel 406 has a relatively rectangular cross-section, and in FIG. 7D, the channel has a polygonal, or otherwise shaped cross-section (e.g., partially or fully elliptical, irregular, etc.). In various embodiments, the width of the cross-section of the channel 406 and the seal (402 and/or 404), where the seal (402 and/or 404) makes contact with the embedded metallic ring 702, is less (e.g., 60% or less) than the width of the cross-section of the embedded metallic ring 702. The metallic fill for the seals 404 may be fully (as seen in FIG. 7C) or partially (as seen in FIG. 7D) lining the interior walls of the channel 406, while making contact with (landed on) the embedded metallic ring 702. In various embodiments, the shape of the channel 406 may be predetermined, or may be a product of the drilling techniques employed to form the channel 406.

Figure 8:
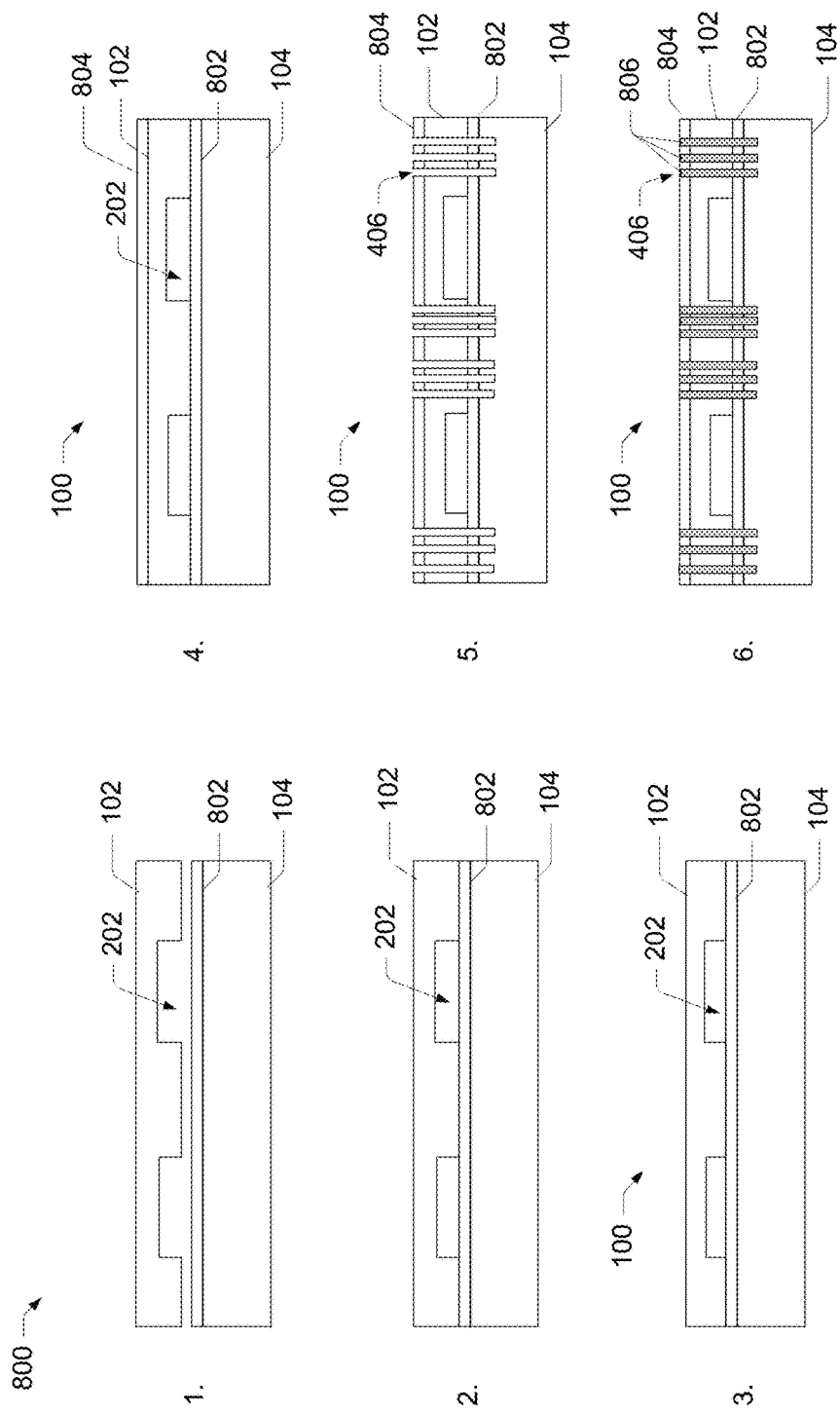
FIG. 8 is a graphical flow diagram illustrating an example processing sequence to form a sealed microelectronic device, according to another embodiment.

FIG. 8 is a graphical flow diagram illustrating an example processing sequence 800 to form a sealed microelectronic device 100, according to another embodiment using interior seals (e.g., 806). In various embodiments, the process 800 described with reference to FIG. 8 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially or fully filled/plated with a metallic material (e.g., copper) to form filled seal rings 806. The filled seal rings 806 hermetically seal the bond joints between the cavity wafer 102 and the second wafer 104, sealing the cavities 202. In an implementation, the top exposed portion of the metallic seal rings 806 comprise a redistribution layer (RDL).

Figure 9A:
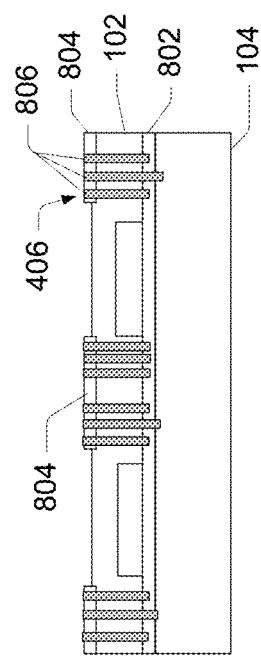
FIGS. 9A-9C illustrate example embodiments of sealed microelectronic devices, according to various embodiments.
Figure 9B:
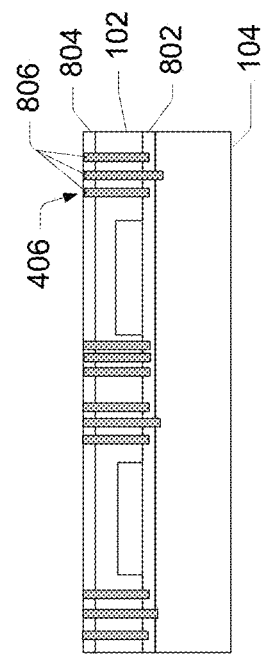
Figure 9C:
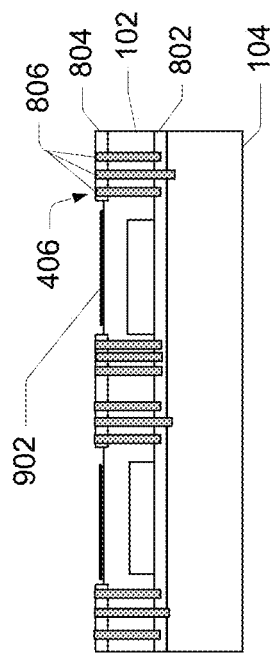

Referring to FIGS. 9A-9C, several embodiments of the sealed microelectronic device 100 are illustrated as examples. FIG. 9A shows a sealed microelectronic device 100 wherein the bottom portion of the one or more filled seal rings 806 is disposed within the layer 802 (which may be a dielectric layer, for example), and may or may not penetrate the second wafer 104. An opposite end of the filled seal rings 806 (e.g., at the top of the cavity wafer 102) may be exposed and contact a metal layer for electrical (and/or heat dissipation) function of the microelectronic device 100, for example.

FIG. 9B shows another sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over a portion of the exposed surface of the cavity wafer 102. In the embodiment, the dielectric layer 804 is patterned so that the dielectric layer 804 is not covering over the one or more cavities 202. FIG. 9C shows a further sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over one or more portions of the exposed surface of the cavity wafer 102. In the embodiment, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

Figure 10:
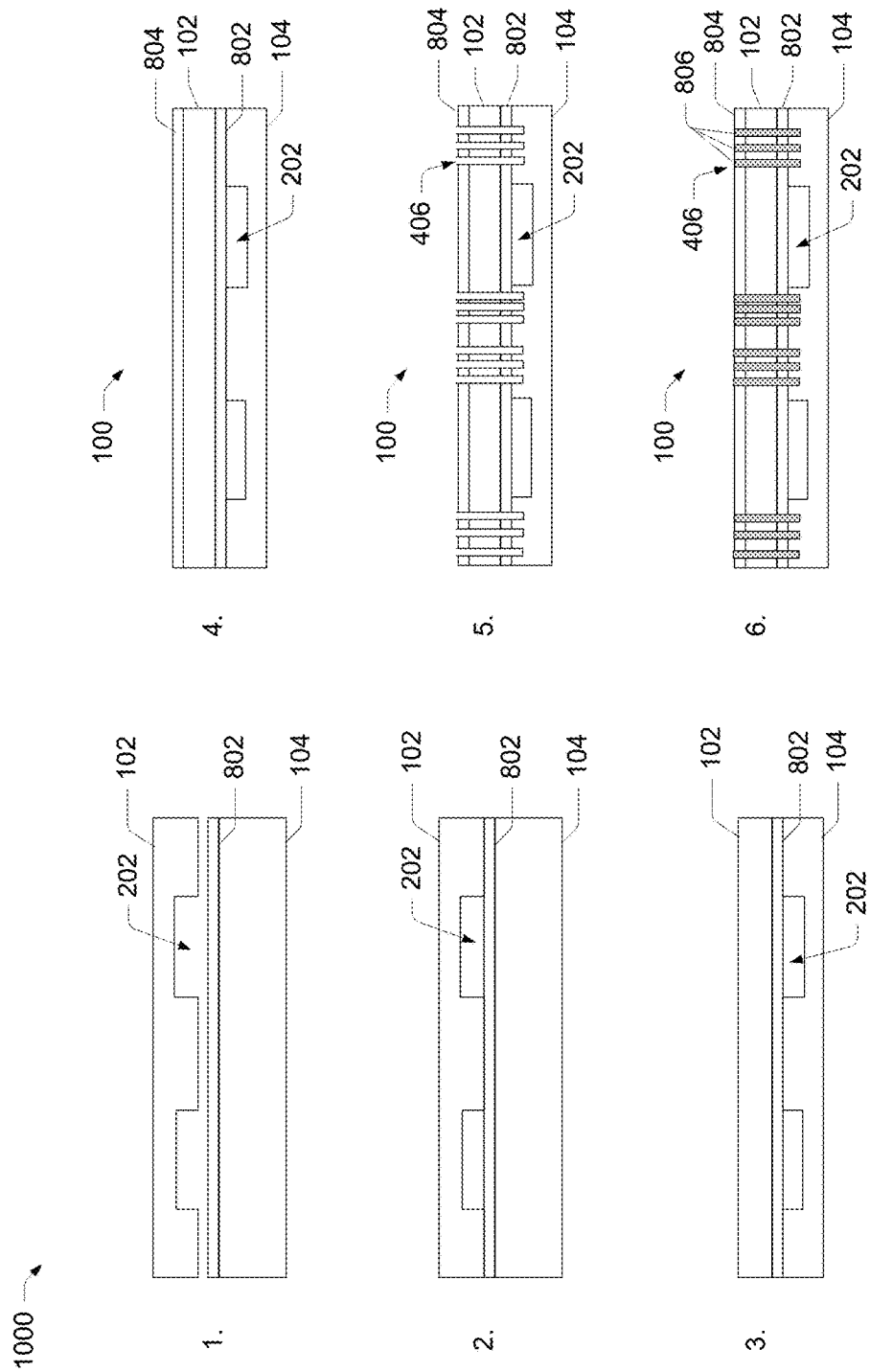
FIG. 10 is a graphical flow diagram illustrating an example processing sequence to form a sealed microelectronic device, according to a further embodiment.

FIG. 10 is a graphical flow diagram illustrating an example processing sequence 1000 to form a sealed microelectronic device 100, according to another embodiment using interior seals (e.g., 806). In various embodiments, the process 1000 described with reference to FIG. 10 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. Further, the assembly featuring the cavity wafer 102 and the second wafer 104 may be flipped for processing from the second wafer 104 side. At block 4, a coating or layer 804, such as a dielectric layer or the like, may be applied to the exposed surface of the second wafer 104. At block 5, one or more channels 406 (or "cavity rings," partly or fully surrounding the cavities 202) can be formed through portions of the second wafer 104, portions of the cavity wafer 102, and through one or both of the layers 802 and 804. The channels 406 may be formed by etching, drilling, or otherwise removing material from the wafers 102 and 104, and may be open to an outside surface of the second wafer 104 or the cavity wafer 102. As discussed above, the channels may extend only the interface between wafers (or dies) 102 and 104 and may extend to one or more metallic features such as a pad or via on or within wafer 104.

At block 6, the cavity ring channels 406 can be partially or fully filled/plated with a metallic material (e.g., copper) to form filled seal rings 806. The filled seal rings 806 hermetically seal the bond joints between the second wafer 104 and the cavity wafer 102, sealing the cavities 202. In an implementation, the top exposed portion of the metallic seal rings 806 may comprise a redistribution layer (RDL).

Figure 11B:
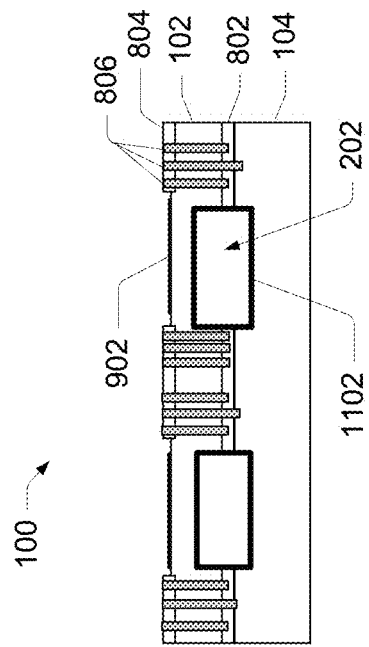
FIGS. 11A and 11B illustrate example embodiments of sealed microelectronic devices, according to various embodiments.
Figure 11A:
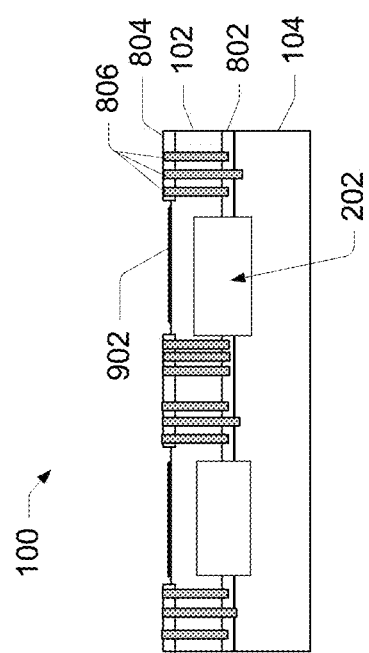

Referring to FIGS. 11A-11B, embodiments of the sealed microelectronic device 100 are illustrated as examples. FIGS. 11A and 11B show sealed microelectronic devices 100 wherein the bottom portion of the filled seal rings 806 is disposed within the layer 802 (which may be a dielectric layer, for example), and may or may not penetrate the cavity wafer 102. An opposite end of the filled seal rings 806 (e.g., at the top of the second wafer 104) may be exposed and contact a metal layer for electrical function of the microelectronic device 100, for example. In the embodiments, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

In various embodiments, as shown at FIGS. 11A and 11B, the one or more cavities 202 extend into the second wafer 104 as well as the cavity wafer 102. The filled seal rings 806 hermetically seal the bond joints between the second wafer 104 and the cavity wafer 102, sealing the cavities 202. Additionally, as shown in FIG. 11B, a metallic barrier layer 1102 may be applied within one or more of the cavities 202 to further seal the one or more cavities 202. The metallic barrier 1102 can be disposed on the side walls, or on the side, top, and bottom walls, partially or fully covering the inside surfaces of the cavities 202, as shown in FIG. 11B. In an implementation, the metallic barrier 1102 may be applied to the inside surfaces of the cavities 202 prior to bonding the cavity wafer 102 to the second wafer 104. The bonding process may include a metal-to-metal bonding (such as DBI, for instance), with or without a heated annealing, to bond the metallic barrier 1102 disposed on the inside surfaces of the cavity wafer 102 to the metallic barrier 1102 disposed on the inside surfaces of the second wafer 104, forming a continuous metallic sealing barrier 1102.

Figure 12:
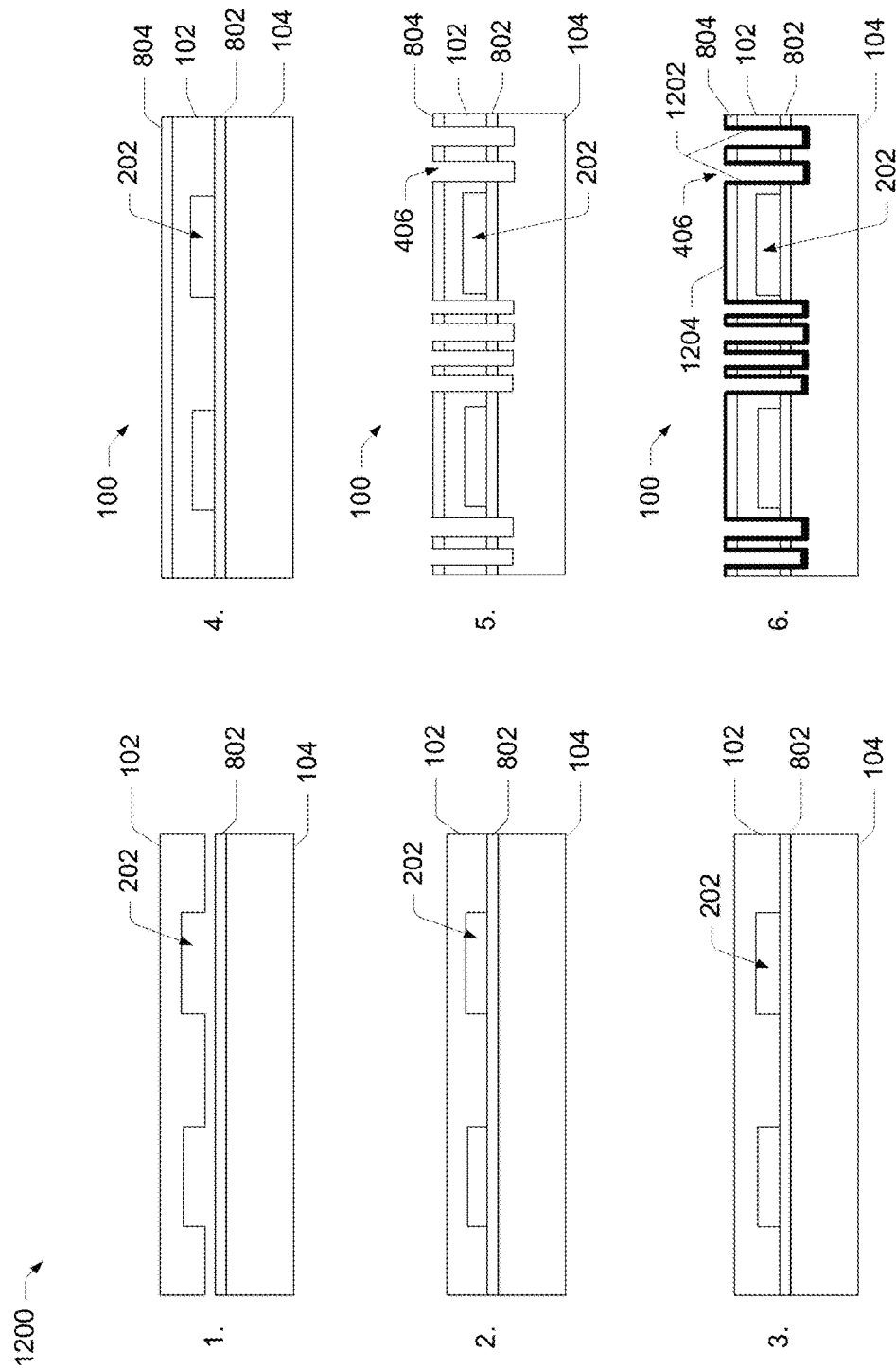
FIG. 12 is a graphical flow diagram illustrating an example processing sequence to form a sealed microelectronic device, according to an additional embodiment.

FIG. 12 is a graphical flow diagram illustrating an example processing sequence 1200 to form a sealed microelectronic device 100, according to another embodiment using interior seals (e.g., 1202). In various embodiments, the process 1200 described with reference to FIG. 12 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104 (which may or may not be a MEMS wafer, for example). In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx—SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially filled/plated with a metallic material (e.g., copper) to form conformal seal rings 1202. The seal rings 1202 hermetically seal the bond joints between the cavity wafer 102 and the second wafer 104, sealing the cavities 202. In various embodiments, the channels 406 can be filled/plated to form the conformal seal rings 1202 while a metallic layer 1204 is deposited onto at least a portion of the exposed surface of the cavity wafer 102. Accordingly, in various embodiments, the channels 406 are filled in the same or in separate processes as the deposition of the metallic layer 1204.

Referring to FIGS. 13A-13C, several embodiments of the sealed microelectronic device 100 are illustrated as examples. FIGS. 13A-13C show sealed microelectronic devices 100 wherein the seal rings 1202 are formed through the cavity layer 102, and the bottom portion of the seal rings 1202 is disposed through the layer 802 (which may be a dielectric layer, for example) and also penetrate the second wafer 104. FIGS. 13A and 13B show partially filled seal rings 1202 (e.g., plated in a vacuum, for example), with the embodiment shown at FIG. 13B having a greater quantity of metal within the partially filled seal rings 1202 than the embodiment shown at FIG. 13A. Annealing the substrates (bonded wafers 102 and 104) in the partially filled condition at temperatures between 80 and 250 C can enlarge the grain size of the plated metal (e.g., 1202 and/or 1204). The process of producing the enlarged grain sizes can reduce impurities within the metal layer of the seal rings 1202 and/or the metallic layer 1204. In an implementation, the grains have a general (e.g., average) diameter that is greater than 10 percent of the width dimension of the channel 406.

FIG. 13C shows fully filled seal rings 1202 within the channels 406. In some embodiments, the annealed metal of the partially filled seal rings 1202, as shown in FIGS. 13A and 13B, can be added to or coated with an additional metal layer to form the fully filled seal rings 1202. In an embodiment, the sealed microelectronic device 100 may be annealed again after deposition of the additional metal layer. In some cases, CMP may be used prior to the final annealing or afterwards, to form a desired surface for the filled seal rings 1202. One or more additional materials may be provided in the unfilled portion of the seal ring 1202, as needed, for reliability, robustness, performance, etc.

The top (e.g., exposed) end of the filled seal rings 1202 (e.g., at the top surface of the cavity wafer 102) may be exposed and contact a metal layer for electrical function of the microelectronic device 100, for example, when bonded to another device.

The quantity of seal rings 302, 402, 404, 806, and 1202 shown in the illustrations of FIGS. 1-13 are for example and discussion. In various embodiments, a sealed microelectronic device 100 or like assembly may include fewer, or a greater quantity of seal rings 302, 402, 404, 806, and 1202, and remain within the scope of the disclosure. Moreover, various implementations described herein may be combined to further enhance the improvement over conventional techniques of fabricating a MEMS device. For example, while seal rings are shown to extend into one surface from one side of the component, seal rings may be formed from both sides and may contact each other to form a metallic structure fully extending through the sealed microelectronic device 100.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method of forming a microelectronic assembly, comprising:
    bonding a first insulating surface of a first microelectronic component to a second insulating surface of a second microelectronic component, the first insulating surface and the second insulating surface forming a bond joint where the first insulating surface and the second insulating surface make contact; and
    forming a seal over the bond joint, the seal covering the bond joint, the seal comprising a metallic material and sealing the bond joint between the first microelectronic component and the second microelectronic component.

2. The method of claim 1, further comprising forming the seal by depositing the metallic material over the bond joint via electroless plating or printing.

3. The method of claim 1, further comprising forming the seal to be continuous over a periphery of at least one of the first microelectronic component and the second microelectronic component.

4. The method of claim 1, wherein the bond joint comprises a first bond joint and the seal comprises a first seal, the method further comprising bonding at least one of the first insulating surface and the second insulating surface to a third insulating surface, forming at least a second bond joint where the third insulating surface makes contact with the first insulating surface or the second insulating surface; and
    forming a second seal over the second bond joint, the second seal covering the second bond joint, the second seal comprising a metallic material and sealing the second bond joint.

5. The method of claim 4, wherein the second seal comprises a portion of the first seal, the method further comprising forming the first seal over the first and second bond joints, the first seal covering the first and second bond joints and sealing the first and second bond joints.

6. The method of claim 1, wherein the first insulating surface is bonded to the second insulating surface using an adhesive-less, room temperature, covalent bonding technique.

7. The method of claim 1, wherein the first insulating surface is bonded to the second insulating surface using a die attach film or paste via a polymeric bonding technique.

8. The method of claim 1, wherein the seal comprises a hermetic seal arranged to prevent fluid leakage at the bond joint greater than $1 \times 10^{-6}$ atm-cm3 per second.

9. A method of forming a microelectronic assembly, comprising:
    bonding a first insulating surface of a first microelectronic component to a second insulating surface of a second microelectronic component, the first insulating surface and the second insulating surface forming a bond joint where the first insulating surface and the second insulating surface make contact;
    forming a first channel in the first insulating surface;
    forming a second channel through the second microelectronic component, the second channel aligned with the first channel, the first channel and the second channel intersecting the bond joint;
    forming a seal within the first channel and the second channel, the seal being continuous from the first channel to the second channel, the seal comprising a metallic material and sealing the bond joint between the first microelectronic component and the second microelectronic component.

10. The method of claim 9, further comprising forming the seal by depositing the metallic material at the bond joint via electroless plating.

11. The method of claim 9, further comprising conforming the metallic material to multiple surfaces of the first channel and the second channel.

12. The method of claim 9, further comprising forming the seal to be continuous within a periphery of at least one of the first microelectronic component and the second microelectronic component.

13. The method of claim 9, further comprising decreasing fluid flow across the bond joint by forming the seal within the first channel and the second channel.

14. The method of claim 9, wherein the seal comprises a hermetic seal arranged to prevent fluid leakage at the bond joint greater than $1 \times 10^{-6}$ atm-cm3 per second.

* * * * *